US010263023B2

(12) United States Patent
Tazoe et al.

(10) Patent No.: US 10,263,023 B2
(45) Date of Patent: Apr. 16, 2019

(54) DEVICE, ELECTRONIC APPARATUS, AND TRANSPORT APPARATUS

(71) Applicant: CANON KABUSHIKI KAISHA, Tokyo (JP)

(72) Inventors: Koichi Tazoe, Sagamihara (JP); Kazuya Igarashi, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 15/926,948

(22) Filed: Mar. 20, 2018

(65) Prior Publication Data

US 2018/0286904 A1  Oct. 4, 2018

(30) Foreign Application Priority Data

Mar. 28, 2017 (JP) ................. 2017-063072

(51) Int. Cl.
*H01L 33/50* (2010.01)
*H01L 27/146* (2006.01)

(52) U.S. Cl.
CPC .. *H01L 27/14621* (2013.01); *H01L 27/14627* (2013.01); *H01L 27/14629* (2013.01); *H01L 33/508* (2013.01)

(58) Field of Classification Search
CPC .................................... H01L 33/508
USPC .................................... 257/98
See application file for complete search history.

(56) References Cited

U.S. PATENT DOCUMENTS

| | | | | |
|---|---|---|---|---|
| 4,565,756 A | * | 1/1986 | Needs | G03F 7/0007 257/214 |
| 2003/0001992 A1 | * | 1/2003 | Kawase | B41J 2/14233 349/106 |
| 2005/0042797 A1 | * | 2/2005 | Lin | G02F 1/133516 438/70 |
| 2005/0056901 A1 | * | 3/2005 | Kuriyama | H01L 27/14621 257/428 |
| 2007/0145439 A1 | * | 6/2007 | Han | H01L 27/14621 257/291 |
| 2007/0200980 A1 | * | 8/2007 | Fukuchi | G02F 1/133516 349/106 |
| 2007/0237888 A1 | * | 10/2007 | Liu | H01L 27/14621 427/58 |
| 2009/0273746 A1 | * | 11/2009 | Uehara | G02F 1/133555 349/106 |
| 2011/0068998 A1 | * | 3/2011 | Wang | G02B 5/201 345/32 |
| 2012/0261782 A1 | | 10/2012 | Kobayashi | |
| 2014/0339606 A1 | | 11/2014 | Lin | |
| 2014/0367817 A1 | | 12/2014 | Furuta | |

(Continued)

FOREIGN PATENT DOCUMENTS

| | | |
|---|---|---|
| JP | H06-53451 A | 2/1994 |
| JP | 2009111225 A | 5/2009 |
| JP | 1598680 B2 | 12/2010 |

(Continued)

*Primary Examiner* — George Fourson, III
(74) *Attorney, Agent, or Firm* — Canon U.S.A., Inc. IP Division

(57) ABSTRACT

A color filter layer and a light transmissive layer have a groove between a first color filter and a second color filter and between a first light transmissive portion and a second light transmissive portion. The groove contains a member located at least between the first color filter and the second color filter. The member has a refractive index higher than 1.0.

20 Claims, 8 Drawing Sheets

(56) References Cited

U.S. PATENT DOCUMENTS

2016/0268488 A1\* 9/2016 Goeoetz ............ C09K 11/7774

FOREIGN PATENT DOCUMENTS

| JP | 2011040454 A | 2/2011 |
|----|--------------|--------|
| JP | 2011069858 A | 4/2011 |
| JP | 2011134788 A | 7/2011 |
| JP | 4998310 B2 | 8/2012 |
| JP | 5064426 B2 | 10/2012 |
| JP | 2013258021 A | 12/2013 |
| JP | 5430387 B2 | 2/2014 |
| JP | 2014225667 A | 12/2014 |
| JP | 2015002340 A | 1/2015 |

\* cited by examiner

US 10,263,023 B2

DEVICE, ELECTRONIC APPARATUS, AND TRANSPORT APPARATUS

BACKGROUND OF THE INVENTION

Field of the Invention

The present disclosure relates to a device including a color filter layer.

Description of the Related Art

Japanese Patent Laid-Open No. 2011-134788 discloses a solid-state image capturing apparatus in which a void is disposed at a position corresponding to a boundary between adjacent color filters of a color filter layer. The void extends to a planarizing layer. A sealing layer for sealing the void is disposed on the void and a second planarizing layer.

Japanese Patent Laid-Open No. 2009-111225 discloses a color filter array including a separation wall that separates a color filter layer and a color filter layer from each other.

The technique disclosed in Japanese Patent Laid-Open No. 2011-134788 provides low light use efficiency, and the technique disclosed in Japanese Patent Laid-Open No. 2009-111225 provides poor optical uniformity, so that they cannot fully improve the optical characteristics.

SUMMARY OF THE INVENTION

According to an aspect of the present disclosure, a device is provided having improved optical characteristics. According to another aspect of the present disclosure, a device includes a substrate, a color filter layer disposed on the substrate, a light transmissive layer disposed opposite to the substrate with respect to the color filter layer, and a member. The color filter layer includes a first color filter and a second color filter. The light transmissive layer includes a first light transmissive portion located on the first color filter and a second light transmissive portion located on the second color filter. The color filter layer and the light transmissive layer have a groove between the first color filter and the second color filter and between the first light transmissive portion and the second light transmissive portion. The member is disposed at least in a portion of the groove between the first color filter and the second color filter. The member has a refractive index higher than 1, and/or the member is a solid.

Further features of the present disclosure will become apparent from the following description of example embodiments with reference to the attached drawings.

DESCRIPTION OF THE EMBODIMENTS

Various example embodiments of the present disclosure will be described hereinbelow with reference to the drawings. In the following descriptions and drawings, common configurations across a plurality of drawings are identified by the same reference signs. For that reason, common configurations will be described with reference to a plurality of drawings, and repeat descriptions of configurations identified by the same reference signs will be omitted as appropriate.

Figure 1A:
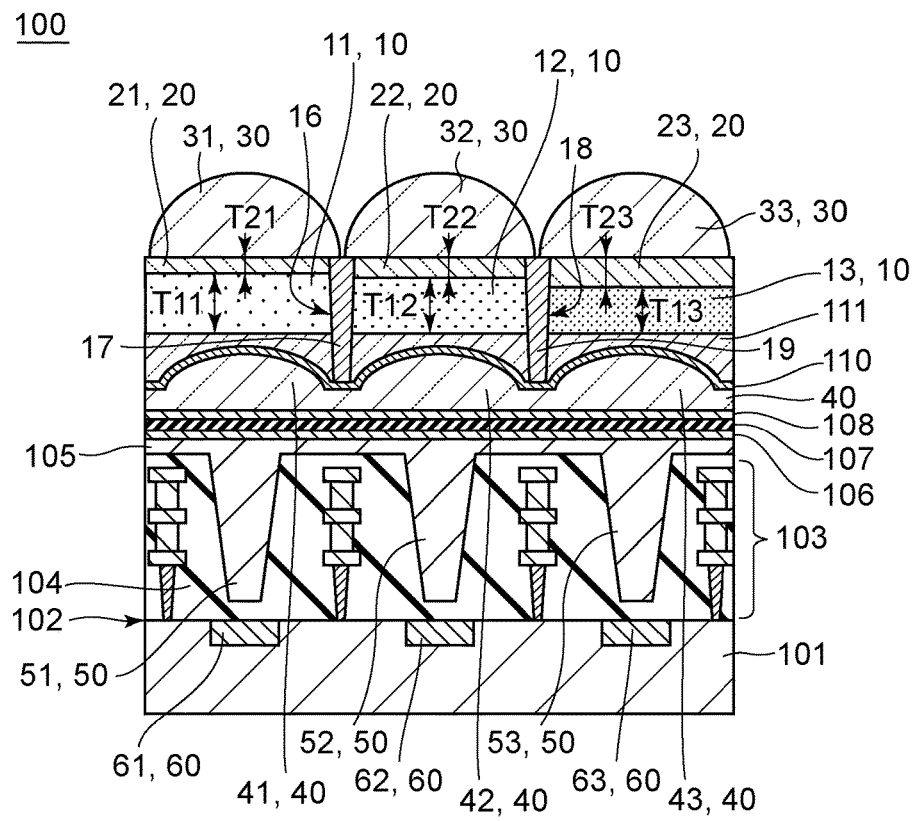
FIG. 1A is a schematic cross-sectional view of a device according to an embodiment of the present disclosure.

FIG. 1A is a schematic cross-sectional view of an example of a device 100 according to an embodiment of the present disclosure. The device 100 is an electronic device, such as a semiconductor device. Applications include optical devices, such as an image capturing device and a display device. The device 100 of the present embodiment is an image capturing device.

The device 100 includes a substrate 101, a color filter layer 10 disposed above the substrate 101, and a light transmissive layer 20 disposed opposite to the substrate 101 with respect to the color filter layer 10. The color filter layer 10 includes a first color filter 11 of a first color, a second color filter 12 of a second color, and a third color filter 13 of a third color. For example, the first color is red, the second color is blue, and the third color is green, but this is given for mere illustration and is not limited the combination. The light transmissive layer 20 includes a first light transmissive portion 21, a second light transmissive portion 22, and a third light transmissive portion 23. The first light transmissive portion 21 is a portion of the light transmissive layer 20 located on the first color filter 11. The second light transmissive portion 22 is a portion of the light transmissive layer 20 located on the second color filter 12. The third light transmissive portion 23 is a portion of the light transmissive layer 20 located on the third color filter 13.

The color filter layer 10 and the light transmissive layer 20 respectively have a groove 16 between the first color filter 11 and the second color filter 12 and between the first light transmissive portion 21 and the second light transmissive portion 22. The color filter layer 10 and the light transmissive layer 20 further respectively have a groove 18 between the second color filter 12 and the third color filter 13 and between the second light transmissive portion 22 and the third light. transmissive portion 23.

In the groove 16, a partitioning member 17 located at least between the first color filter 11 and the second color filter 12 is disposed. In the groove 18, a partitioning member 19 located at least between the second color filter 12 and the third color filter 13 is disposed. The refractive indices of the partitioning members 17 and 19 are higher than 1.0. The partitioning members 17 and 19 may be liquid or solids. When the partitioning members 17 and 19 are liquid or solids, the refractive indices of the partitioning members 17 and 19 are higher than 1.0. The first to third color filters 11 to 13 may be resin materials containing pigment. Disposing the partitioning members 17 and 19 improves the light use efficiency, thereby improving the sensitivity as the image capturing device.

The refractive index of the partitioning member 17 may be lower than the refractive index of the first color filter 11 and the refractive index of the second color filter 12. To enhance the light use efficiency, the refractive index of the partitioning member 19 may be lower than the refractive index of the second color filter 12 and the refractive index of the third color filter 13. The refractive indices of the color filters 11, 12, and 13 can be 1.6 to 1.8. The partitioning members 17 and 19 can be made of a material containing silicon oxide, a material containing silicon oxynitride, or a material having a plurality of voids. Examples of the material having a plurality of voids include a material in which hollow particles are dispersed in a binder, a material in which solid particles are arranged in chains, between which a void is formed, and a porous material.

Typically, the thickness T11 of the first color filter 11 is larger than the thickness T12 of the second color filter 12 all (T11>T12). The thickness T12 of the second color filter 12 is larger than the thickness T13 of the third color filter 13 (T12>T13). In other words, the relation of T11>T12>T13 holds.

The thickness T21 of the first light transmissive portion 21 is smaller than the thickness T22 of the second light transmissive portion 22 (T21<T22). The thickness T22 of the second light transmissive portion 22 is smaller than the thickness T23 of the third light transmissive portion 23 (T22<T23). In other words, the relation of T21<T22<T23 holds. Typically, the light transmissive layer 20 is a planarizing layer that planarizes irregularities due to the difference in thickness among the color filters 11, 12, and 13 of the color filter layer 10. Therefore, the relation of T11+T21=T12+T22=T13+T23 is satisfied in the present embodiment.

In the present embodiment, the partitioning member 17 extends between the first light transmissive portion 21 and the second light transmissive portion 22. The partitioning member 19 extends between the second light transmissive portion 22 and the third light transmissive portion 23. In the present embodiment, the distance from the substrate 101 to the upper ends of the partitioning members 17 and 19 is equal to the distance from the main surface 102 of the substrate 101 to the upper surface of the light transmissive layer 20. The distance from the substrate 101 to the upper end of the partitioning member 17 may be smaller than the distance from the main surface 102 of the substrate 101 to the upper surface of the light transmissive layer 20, while the partitioning member 17 is extended between the first light transmissive portion 21 and the second light transmissive portion 22. This also applies to the partitioning member 19.

The upper ends of the partitioning members 17 and 19 are respective ends of the partitioning members 17 and 19 opposite to the substrate 101. The lower ends of the partitioning members 17 and 19 are respective ends of the partitioning members 17 and 19 opposite to the upper ends and adjacent to the substrate 101. In the present embodiment, the lower ends of the partitioning members 17 and 19 are respectively in contact with the bottoms of the grooves 16 and 18. The lower ends of the partitioning members 17 and 19 may be respectively separated from the bottoms of the grooves 16 and 18. The reference of the distance from the substrate 101 may be set on the main surface 102 of the substrate 101. In the image capturing device, the main surface 102 of the substrate 101 serves as a light-receiving surface. The upper surface of the light transmissive layer 20 is a surface of the light transmissive layer 20 opposite to the color filter layer 10 and the substrate 101. The lower surface of the light transmissive layer 20 is a surface of the light transmissive layer 20 opposite to the upper surface and adjacent to the color filter layer 10. The distance from the substrate 101 to the lower surface of the light transmissive layer 20 differs according to the first light transmissive portion 21, the second light transmissive portion 22, and the third light transmissive portion 23 of the light transmissive layer 20. In the present embodiment, the distance from the substrate 101 to the upper surface of the light transmissive layer 20 does not differ according to the first light transmissive portion 21, the second light transmissive portion 22, and the third light transmissive portion 23 of the light transmissive layer 20, but the distance may differ. However, the difference in the distance from the substrate 101 to the upper surface of the light transmissive layer 20 due to the first light transmissive portion 21, the second light transmissive portion 22, and the third light transmissive portion 23 is smaller than a difference in the distance from the substrate 101 to the lower surface of the light transmissive layer 20 due to the first light transmissive portion 21, the second light transmissive portion 22, and the third light transmissive portion 23. The distances between the upper surface and the lower surface of the light transmissive layer 20 are the thicknesses T21, T23, and T23, described above.

The lower surface of the light transmissive layer 20 can be in contact with the color filter layer 10. It is also possible to make a portion of the groove 16 between the first light transmissive portion 21 and the second light transmissive portion 22 and a portion of the groove 18 between the second light transmissive portion 22 and the third light transmissive portion 23 void without providing the partitioning members 17 and 19, respectively. In that case, the distance from the main surface 102 of the substrate 101 to the upper ends of the partitioning members 17 and 19 is smaller than the distance from the main surface 102 of the substrate 101 to the upper surface of the light transmissive layer 20. To enhance the light use efficiency, the refractive index of the partitioning member 17 may be set lower than the refractive index of the first light transmissive portion 21 and the refractive index of the second light transmissive portion 22.

The device 100 may further include a microlens layer 30 above the color filter layer 10, with the light transmissive layer 20 disposed therebetween. The microlens layer 30 includes a first microlens 31 above the first color filter 11, a second microlens 32 above the second color filter 12, and a third microlens 33 above the third color filter 13. The first light transmissive portion 21 is located between the first microlens 31 and the first color filter 11. The second light transmissive portion 22 is located between the second microlens 32 and the second color filter 12. The third transmissive portion 23 is located between the third microlens 33 and the third color filter 13. The microlens layer 30 of the present embodiment is in contact with the light transmissive layer 20, but another layer may be disposed between the microlens layer 30 and the light transmissive layer 20. The microlens layer 30 may be omitted.

The device 100 may further include a light transmissive film 111 between the color filter layer 10 and the substrate 101. The grooves 16 and 18 are provided also in the light transmissive film 111. The grooves 16 and 18 may not be provided in the light transmissive film 111. In the present embodiment, the partitioning members 17 and 19 respectively extend also in portions of the grooves 16 and 18 in the light transmissive film 111. To enhance the light use efficiency, the refractive indices of the partitioning members 17 and 19 may be lower than the refractive index of the light transmissive film 111. It is also possible to make portions of the grooves 16 and 18 in the light transmissive film 111 void without providing the partitioning members 17 and 19, respectively. It is also possible to omit the light transmissive film 111.

The device 100 may further include an interlayer lens layer 40 between the color filter layer 10 and the substrate 101. The interlayer lens layer 40 includes a interlayer lens 41, a second interlayer lens 42, and a third interlayer lens 43.

The first interlayer lens 41 is disposed between the first color filter 11 and the substrate 101. The second interlayer lens 42 is disposed between the second color filter 12 and the substrate 101. The third interlayer lens 43 is disposed between the third color filter 13 and the substrate 101. The light transmissive film 111 is a planarizing film that planarizes irregularities due to the first interlayer lens 41, the second interlayer lens 42, and the third interlayer lens 43. The groove 16 in the light transmissive film 111 extends between the first interlayer lens 41 and the second interlayer lens 42. The groove 18 in the light transmissive film 111 extends between the second interlayer lens 42 and the third interlayer lens 43. It is also possible to make portions of the grooves 16 and 18 between the first and second interlayer lenses 41 and 42 and between the second and third interlayer lenses 42 and 43 void without providing the partitioning members 17 and 19, respectively. It is also possible to omit the interlayer lens layer 40.

An antireflection layer 110 is disposed between the light transmissive film 111 and the interlayer lens layer 40. The antireflection layer 110 is a thin coating layer extending along the irregularities of the interlayer lens layer 40 and has the function of reducing the reflection between the light transmissive film 111 and the interlayer lens layer 40. In the case where the interlayer lens layer 40 is a silicon nitride layer and the light transmissive film 111 is a resin layer, the antireflection layer 110 may be a silicon oxynitride layer. In the present embodiment, the antireflection layer 110 serves as the bottoms of the grooves 16 and 18. Alternatively, the interlayer lens layer 40 may serve as the bottoms of the grooves 16 and 18.

An interlayer insulating film 104 and a multilayer wiring line 103 are disposed between the color filter layer 10 and the substrate 101. The interlayer insulating film 104 is a multilayer including a plurality of interlayer insulating layers. The multilayer wiring line 103 includes a contact plug, a plurality of wiring lines, and a plurality of via plugs. The interlayer insulating layers constituting the interlayer insulating film 104 are located between the plurality of wiring layers, and the contact plug and the plurality of via plugs pass through the interlayer insulating layers. The multilayer wiring line 103 may have a dual damascene structure in which wiring layer and via plugs are integrated. In the case where the wiring layers contain copper as a main component, the interlayer insulating film 104 can include a copper diffusion prevention layer (not illustrated) in addition to the interlayer insulating layers. The refractive indices of the partitioning members 17 and 19 may be lower than the refractive index of the interlayer insulating film 104 from the viewpoint of improving the light use efficiency. At least the refractive indices of the partitioning members 17 and 19 may be lower than the refractive indices of the interlayer insulating layers of the interlayer insulating film 104. In the interlayer insulating film 104, the refractive index of the interlayer insulating layers containing silicon oxide as a main component can be 1.4 to 1.5.

A plurality of photoelectric conversion elements 61, 62, and 63 are provided in the substrate 101. The plurality of photoelectric conversion elements 61, 62, and 63 are collectively referred to as a photoelectric conversion element 60. The photoelectric conversion element 60 may be photodiode.

The device 100 may further include a plurality of light guides 51, 52, and 53 arrayed between the color filter layer 10 and the substrate 101. The light guide 51 is disposed above the photoelectric conversion element 61. The light guide 52 is disposed above the photoelectric conversion element 62. The light guide 53 is disposed above the photoelectric conversion element 63. The plurality of light guides 51, 52, and 53 are collectively referred to as light guides 50. The light guides 50 are made of a highly-refractive material 105 having a refractive index higher than the refractive index of the interlayer insulating film 104, the highly-refractive material 105 being embedded in openings of the interlayer insulating film 104. Thus, the light guide 50 is surrounded by the interlayer insulating film 104. The refractive index of the light guide 50 is higher than the refractive index of the interlayer insulating film 104. Thus, an optical waveguide structure having a core-clad structure is formed in which the light guide 50 is the core and the interlayer insulating film 104 surrounding the light guide 50 is the clad. The difference between the refractive indices of the color filters 11, 12, and 13 and the refractive indices of the partitioning members 17 and 19 may be smaller than the difference between the refractive index of the light guide 50 and the refractive index of the interlayer insulating film 104 from the viewpoint of improving the light use efficiency of the color filter layer 10 and the light guide 50.

The first microlens 31, the first light transmissive portion 21, the first color filter 11, the first interlayer lens 41, the light guide 51, and the photoelectric conversion element 61 constitute a first pixel unit. The second microlens 32, the second light transmissive portion 22, the second color filter 12, the second interlayer lens 42, the light guide 52, and the photoelectric conversion element 62 constitute a second pixel unit. The third microlens 33, the third light transmissive portion 23, the third color filter 13, the third interlayer lens 43, the light guide 53, and the photoelectric conversion element 63 constitute a third pixel unit.

Figure 1B:
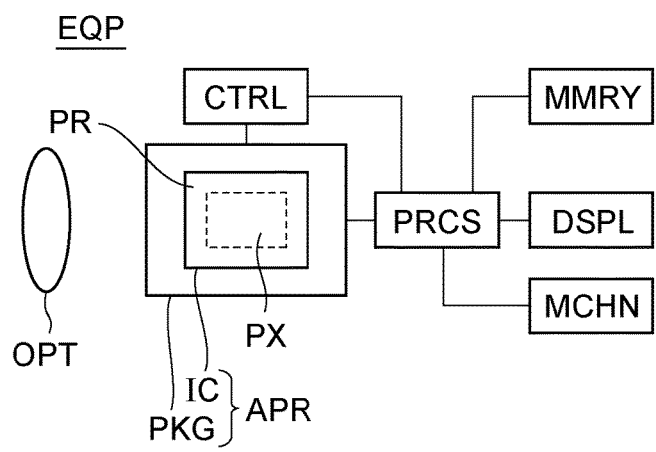
FIG. 1B is a diagram illustrating an example of an apparatus including the device.

FIG. 1B illustrates an example of an apparatus including the device 100 (the details will be described later). An image capturing apparatus APR includes an electronic device IC. The device 100 of the above embodiment may be used as the electronic device IC. An apparatus EQP includes the image capturing apparatus APR.

Figure 2A:
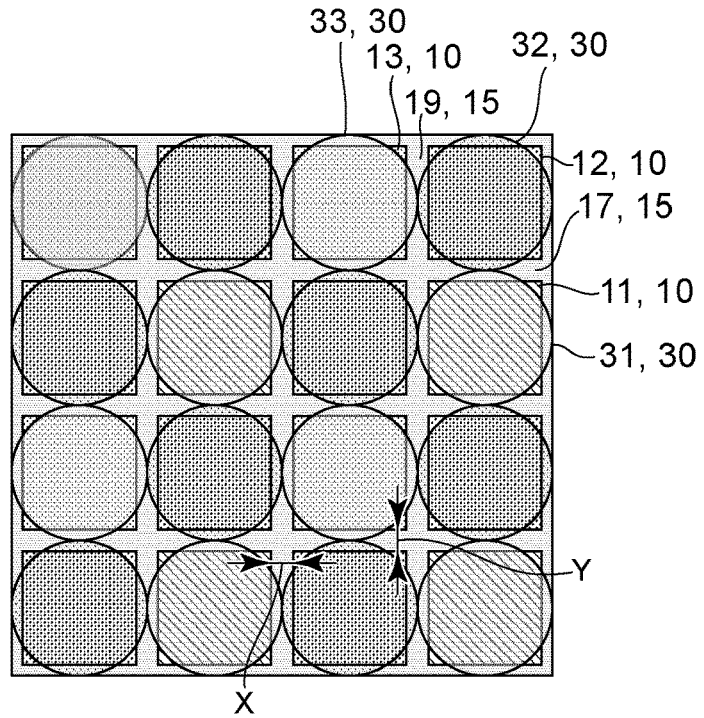
FIG. 2A is a plan view of a device according to an embodiment of the present disclosure.
Figure 2B:
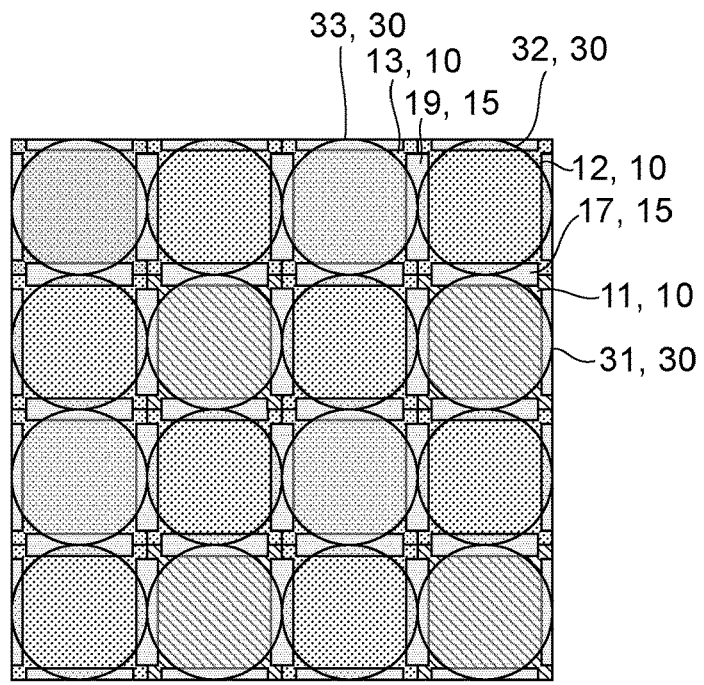
FIG. 2B is a plan view of a device according to an embodiment of the present disclosure.

FIGS. 2A and 2B are plan views of the device 100 including the partitioning members 17 and 19. In the example illustrated in FIG. 2A, the partitioning members 17 and 19 are part of a continuous grid-like partitioning member 15 disposed between the color filters 11, 12, and 13 arranged in a Bayer pattern. The microlens layer 30 is disposed above the color filters 11, 12, and 13. The microlens layer 30 extends to cover the partitioning member 15. The shape and size of the partitioning member 1 are set so that the opening area above the photoelectric conversion unit 60 is as large as possible, and X=Y is satisfied. However, for optical color mixture, there is no problem even if the design values is X≠Y holds because optical color mixture can be reduced by adjusting the values of X and Y. Instead of the grid pattern as illustrated in FIG. 2B, the partitioning members 17 and 19 may be arranged discontinuously, as illustrated in FIG. 2B.

Figure 3A:
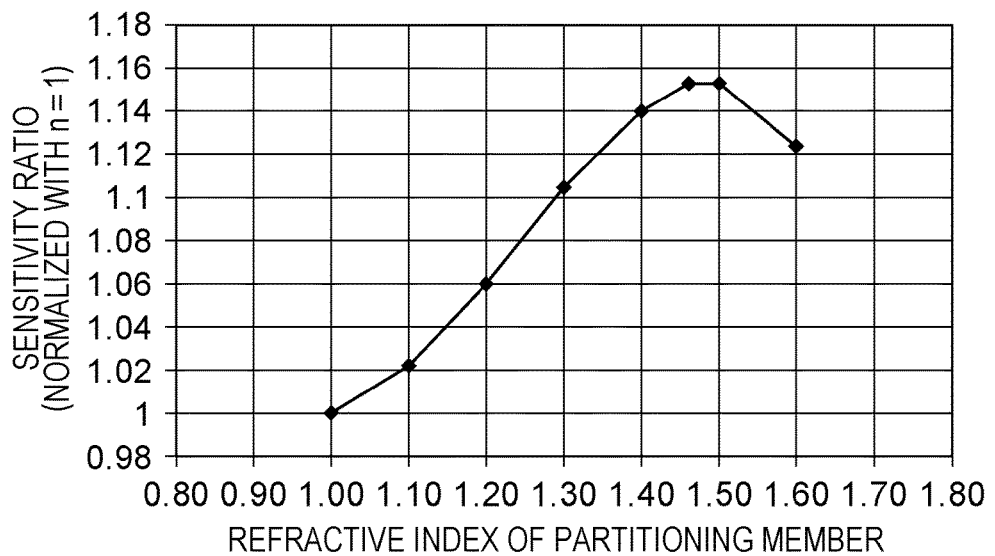
FIG. 3A is a graph illustrating the relationship between a sensor sensitivity and the refractive index of partitioning members.
Figure 3B:
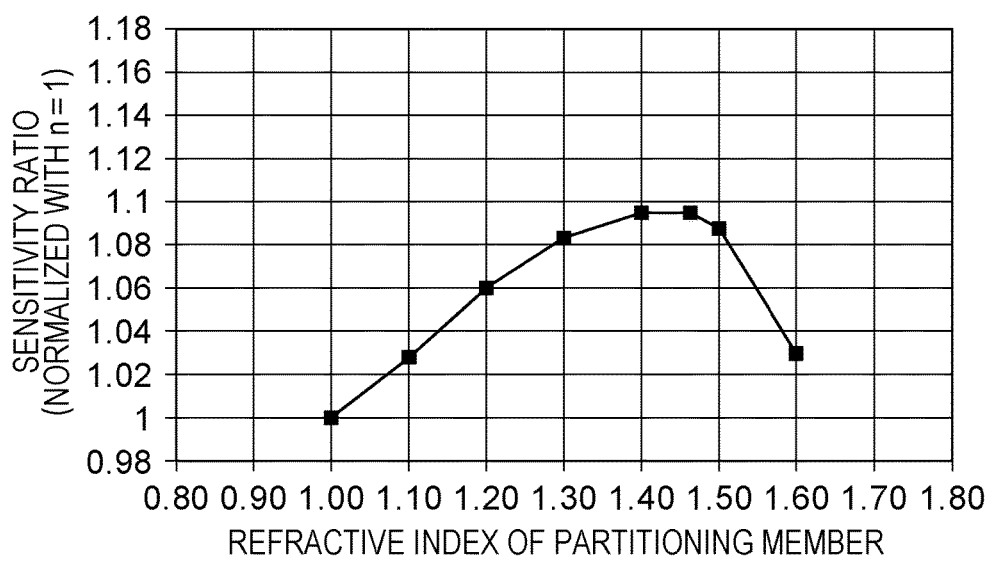
FIG. 3B is a graph illustrating the relationship between a sensor sensitivity and the refractive index of partitioning members.

Referring to FIG. 3A and 3B, the advantageous effects of the present embodiment will be described. FIG. 3A illustrates the relationship between a sensor sensitivity and the refractive index of the partitioning members 17 and 19 when light is incident perpendicularly on the main surface 102 of the substrate 101. The sensor sensitivity is a value normalized with the refractive index 1.0 of the partitioning members 17 and 19. This shows that the sensor sensitivity has the maximum value when the refractive index of the partitioning members 17 and 19 is in the range from 1.4 to 1.5. FIG. 3B illustrates the relationship between the sensor sensitivity and the refractive index of the partitioning members 17 and 19 when light is incident at an angle of 15° from the direction perpendicular to the main surface 102 of the substrate 101. This shows a tendency almost similar to the sensor sensitivity when light is incident perpendicularly on the photoelectric conversion unit 60 and that the refractive index of the partitioning members 17 and 19 has the maximum sensitivity between 1.4 and 1.5. By disposing a solid (or liquid) in the grooves 16 and 18 to make the refractive index in the grooves 16 and 18 higher than 1.0, the light use efficiency, which is used to be lost at the boundary between the color filters, can be enhanced, so that the sensor sensitivity can be improved.

If the grooves 16 and 18 are void (refractive index=1.0), the difference in refractive index between the color filter layer 10 and the void is large. This can make the optical path to the photoelectric conversion element 60 inappropriate. It is presumed that the light totally reflected at the interface between the void and the color filter layer 10 and the light transmissive layer 20 leaks to the adjacent pixels or reflects in the direction opposite to the photoelectric conversion element 60 to cause a decrease in sensitivity.

Without the light transmissive layer 20, the microscopic irregularities of the surfaces of the color filters 11, 12, and 13 may make it difficult to control the behavior of light, increasing light that enters the grooves 16 and 18. Furthermore, without the light transmissive layer 20, the difference among the respective thicknesses T11, 12, and T13 of the color filters 11, 12, and 13 may cause the heights of the grooves 16 and 18 to vary in the plane, causing unevenness of color. By providing the light transmissive layer 20, variations in the depth of the grooves 16 and 18 can be reduced.

Referring to FIGS. 4A to 4D and FIGS. 5A to 5C, a method for manufacturing the device 100 according to the embodiment illustrated in FIG. 1A will be described. In the process illustrated in FIG. 4A, a base member in which the color filter layer 10 is to be formed is prepared. First, the substrate 101 in which the photoelectric conversion elements 60 are disposed is prepared. The photoelectric conversion elements 60 each including a charge storage region are disposed in the substrate 101 which is a semiconductor substrate. The substrate 101 includes an element isolating unit (not illustrated) using local oxidation of silicon (LOCOS) isolation, shallow trench isolation (STI), or PN junction isolation (diffusion isolation). The substrate 101 may include a floating diffusion region for detecting the signal charge of the photoelectric conversion elements 60 and a transfer gate for transferring the signal charge of the photoelectric conversion elements 60 to the floating diffusion region. The substrate 101 may further include a reset transistor for resetting the signal charges of an amplifier transistor connected to the floating diffusion region and the floating diffusion region.

The plurality of multilayer wiring lines 103 are formed on the substrate 101 through the interlayer insulating film 104. The multilayer wiring lines 103 may be made of a material containing aluminum, copper, or tungsten as a main component. Above the photoelectric conversion element 60, openings are provided in the interlayer insulating film 104. The highly-refractive material 105 having a refractive index higher than the interlayer insulating film 104 is embedded in the openings. Thus, the light guides 50 serving as optical waveguides having a core-clad structure are formed.

An antireflection layer 106 and an interlayer insulating 107 are formed on the highly-refractive material 105. The interlayer insulating layer 107 is necessary to form via plugs in a peripheral circuit region (not illustrated).

After an antireflection layer 108 is formed, an interlayer lens layer 40 is formed, and the antireflection layer 110 is further formed. An example of the material of the antireflection layers 106, 108, and 110 is silicon oxynitride. An example of the material of the interlayer lens 40 is silicon nitride.

Figure 4A:
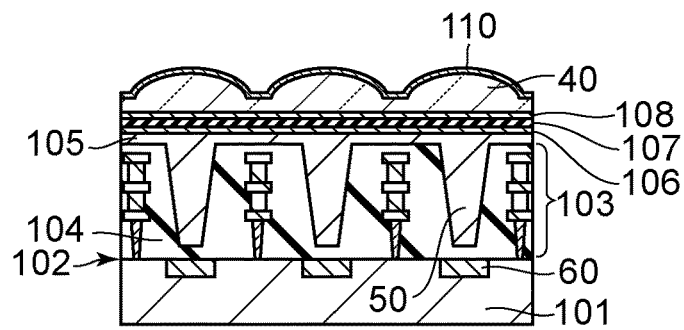
FIG. 4A is a schematic diagram illustrating a method for manufacturing a device according to an embodiment of the present disclosure.
Figure 4B:
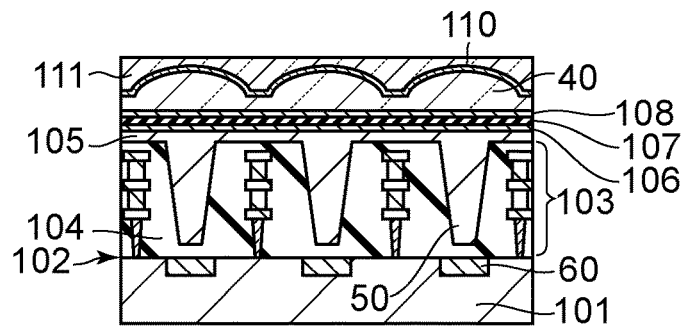
FIG. 4B is a schematic diagram illustrating the next process of the method for manufacturing the device.

In the process illustrated in FIG. 4B, the light transmissive film 111, which is a planarizing film for planarizing the irregularities of the interlayer lens 40, is formed. The light transmissive film 111 can be used as an underlying film for the color filter layer 10.

Figure 4C:
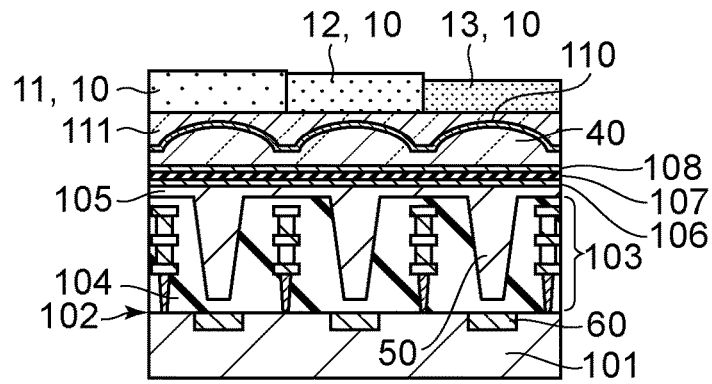
FIG. 4C is a schematic diagram illustrating the next process of the method for manufacturing the device.

In the process illustrated in FIG. 4C, the color filter layer 10 is formed on the light transmissive film 111. For example, the first color filter 11 is red, the second color filter 12 is blue, and the third color filter 13 is green. The thicknesses of the color filters 11 to 13 are often made different to obtain desired spectral characteristics.

Figure 4D:
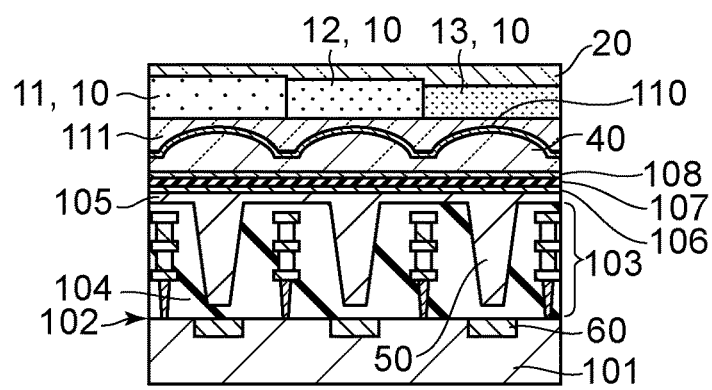
FIG. 4D is a schematic diagram illustrating the next process of the method for manufacturing the device.

In the process illustrated in FIG. 4D, the light transmissive layer 20 serving as a planarizing layer is formed on the color filter layer 10. The light transmissive layer 20 reduces level differences due to the difference in thickness among the color filters 11, 12, and 13.

Figure 5A:
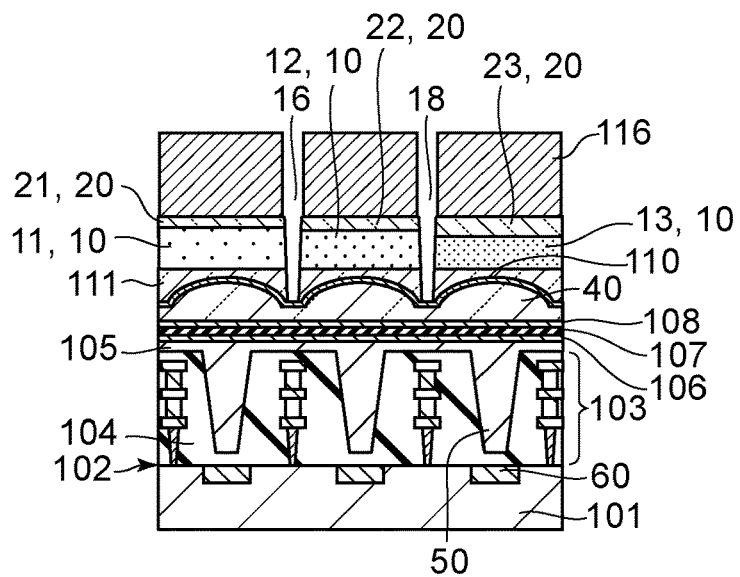
FIG. 5A is a schematic diagram illustrating the next process of the method for manufacturing the device.

In the process illustrated in FIG. 5A, a mask 116 having voids on the boundaries between the color filters 11, 12, and 13 is formed. The mask 116 can be formed by patterning a photoresist by photolithography. The color filter layer 10 is etched using the mask 116 to form the grooves 16 and 18 between the color filters 11, 12, and 13. The color filter layer 10 may be etched by dry etching.

The grooves 16 and 18 are shaped to pass through the light transmissive layer 20, the color filter layer 10, and the light transmissive film 111. The bottoms of the grooves 16 and 18 are formed of the antireflection layer 110. Thus, the light transmissive layer 20 is separated into the first light transmissive portion 21, the second light transmissive portion 22, and the third light transmissive portion 23.

Figure 5B:
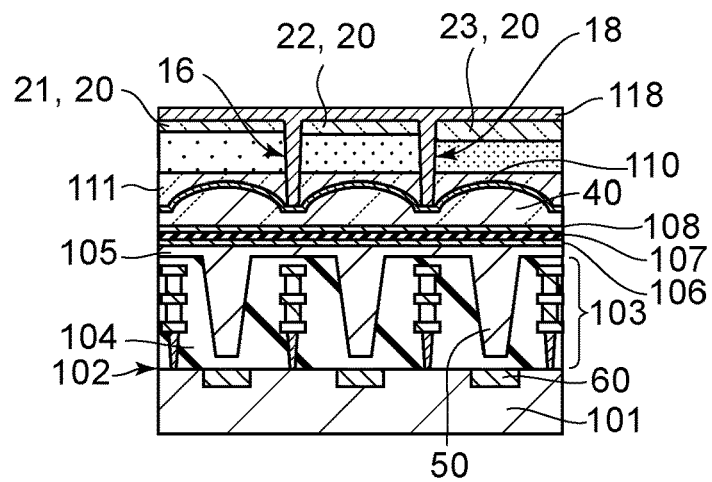
FIG. 5B is a schematic diagram illustrating the next process of the method for manufacturing the device.

In the process illustrated in FIG. 5B, a partition material 118 is deposited in the grooves 16 and 18. The partition material 118 may be deposited using a plasma chemical vapor deposition (CVD) technique, a spin-on glass (SOG) technique, or another coating technique. Examples of the partition material 118 include silicon oxide, silicon oxynitride, or a material having a void structure.

Figure 5C:
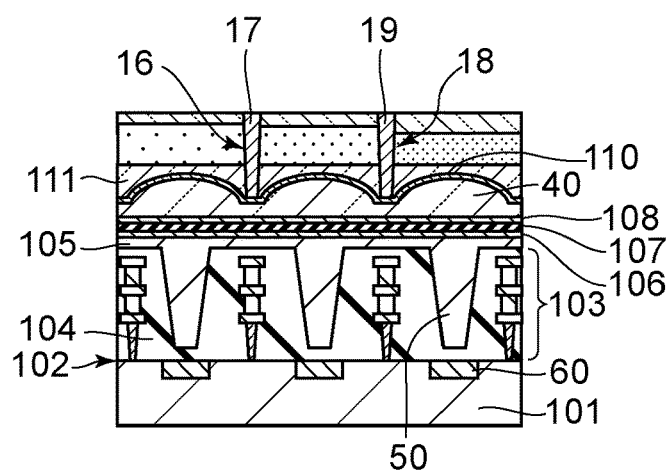
FIG. 5C is a schematic diagram illustrating the next process of the method for manufacturing the device.

In the process illustrated in FIG. 5C, an excessive partition material 118 is removed so that the partition material 118 remains in the grooves 16 and 18. The partitioning member 17 is formed of a portion of the partition material 118 located in the groove 16, and the partitioning member 19 is formed of a portion located in the groove 18. A chemical mechanical polishing (CMP) technique can be used to remove the excessive partition material 118, but an etch back process may be used. Whether the light transmissive layer 20 is exposed can be determined by monitoring the emission intensity in the plasma in a dry etching apparatus for use in the etching process.

After the process illustrated in FIG. 5C, the microlens layer 30 is formed on the light transmissive layer 20 by one of an etch back method, an area gradation method, a reflow method, and an imprinting method, or a combination thereof.

Thus, the device 100 illustrated in FIG. 1A can be manufactured.

Figure 6A:
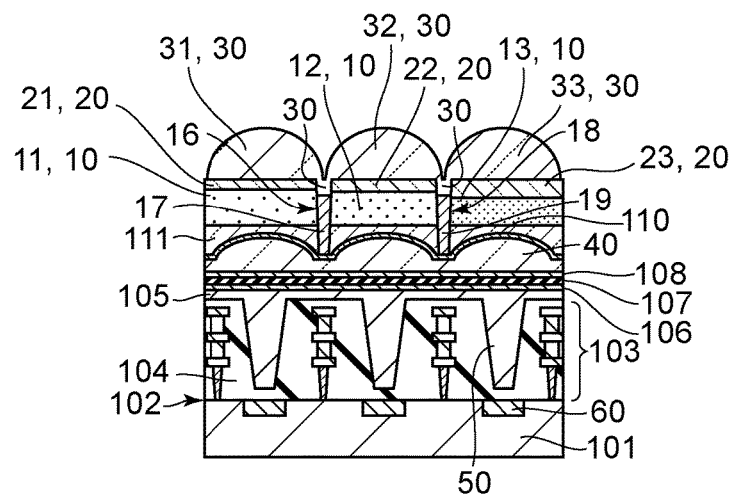
FIG. 6A is a schematic diagram of a device according to another embodiment of the present disclosure.

Other embodiments will be described. In the embodiment of FIG. 6A, the partitioning member 17 does not extend between the first light transmissive portion 21 and the second light transmissive portion 22. Instead, the microlens layer 30 extends between the first light transmissive portion 21 and the second light transmissive portion 22. Likewise, the microlens layer 30 extends between the second light transmissive portion 22 and the third light transmissive portion 23. In the present embodiment, the distance from the main surface 102 of the substrate 101 to the upper ends of the partitioning members 17 and 19 is smaller than the distance from the main surface 102 of the substrate 101 to the upper surface of the light transmissive layer 20.

In the embodiment of FIG. 6A, the interface between the partitioning member 17 and the microlens layer 30 is located between the first color filter 11 and the second color filter 12. Alternatively, the interface between the partitioning member 17 and the microlens layer 30 may be located between the first light transmissive portion 21 and the second light transmissive portion 22. In that case, both of the partitioning member 17 and the microlens layer 30 are located between the first light transmissive portion 21 and the second light transmissive portion 22. This also applies to the partitioning member 19.

Figure 6B:
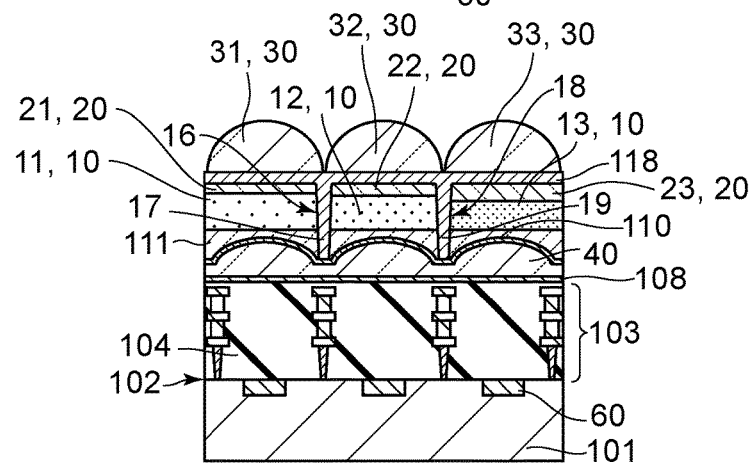
FIG. 6B is a schematic diagram of a device according to another embodiment of the present disclosure.

In an embodiment illustrated in FIG. 6B, the partitioning members 17 and 19 continuously extend between the first microlens 31 and the first light transmissive portion 21, between the second microlens 32 and the second light transmissive portion 22, and between the third microlens 33 and the third light transmissive portion 23. Therefore, the microlens layer 30 is not in contact with the light transmissive layer 20. Furthermore, the distance from the main surface 102 of the substrate 101 to the upper ends of the partitioning members 17 and 19 is larger than the distance from the main surface 102 of the substrate 101 to the upper surface of the light transmissive layer 20. When the partitioning members 17 and 19 are located between the microlens layer 30 and the light transmissive layer 20, the partition material 118 reflects part of light incident on the microlens layer 30, causing a decrease in sensor sensitivity. However, this reduces the influence of variations in etching in the etch back process illustrated in FIG. 5C, so that this embodiment may be advantageous for sensors with emphasis on uniformity.

Figure 6C:
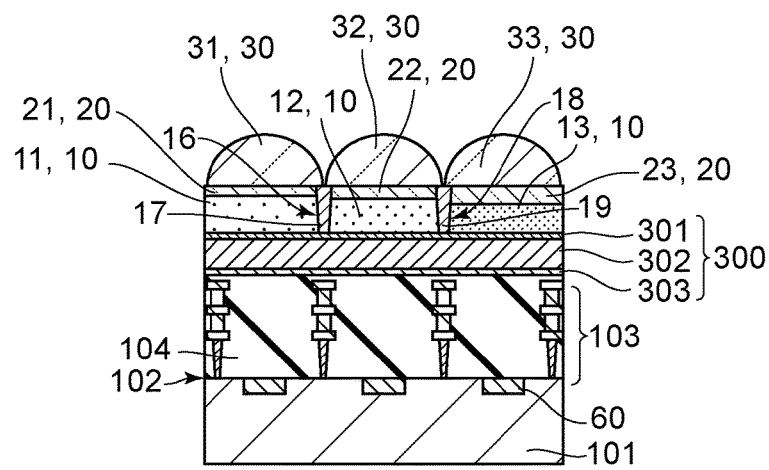
FIG. 6C is a schematic diagram of a device according to another embodiment of the present disclosure.

In an embodiment illustrated in FIG. 6C, a light transmissive film 300 is disposed between the color filter layer 10 and the substrate 101. The light transmissive film 300 functions as a passivation film. In the present embodiment, there is no irregularities of the interlayer lens layer 40 in FIG. 1A, so that the light transmissive film 111 serving as a planarizing film in FIG. 1A is also not present. The light transmissive film 300 is in contact with the color filter layer 10. In the present embodiment, the light transmissive film 300 serves as the bottoms of the grooves 16 and 18. The light transmissive film 300 is a multilayer film having a three layer structure of a silicon oxynitride layer 303, a silicon nitride layer 302, and a silicon oxynitride layer 301. The silicon nitride layer 302 is thicker than the silicon oxynitride layer 301 and the silicon oxynitride layer 303. Instead of the silicon nitride layer 302, a silicon oxynitride layer having a nitrogen concentration higher than those of the silicon oxynitride layer 301 and the silicon oxynitride layer 303 may be used.

The embodiments in FIGS. 6B and 6C do not include the light guides 50. Even without the light guides 50, the light use efficiency can be improved by disposing the partitioning members 17 and 19 in the color filter layer 10. However, with the light guides 50, the light use efficiency can be further improved by the synergistic effect of the combination of the light guides 50 and the partitioning members 17 and 19.

Figure 7A:
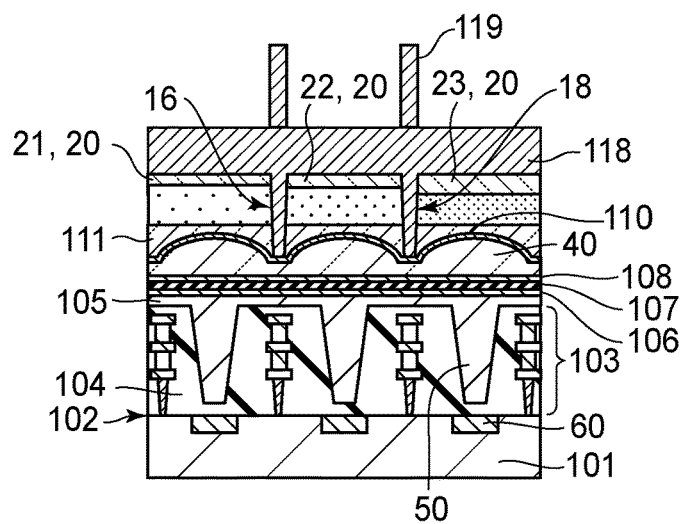
FIG. 7A is a schematic diagram illustrating a method for manufacturing a device according to an embodiment of the present disclosure.
Figure 7B:
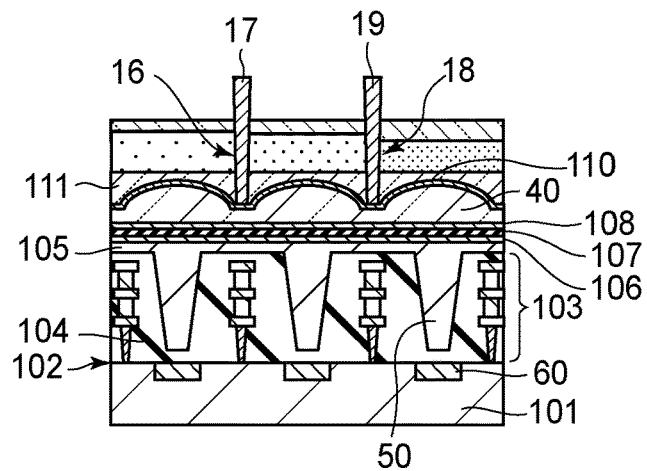
FIG. 7B is a schematic diagram illustrating the next process of the method for manufacturing the device.
Figure 7C:
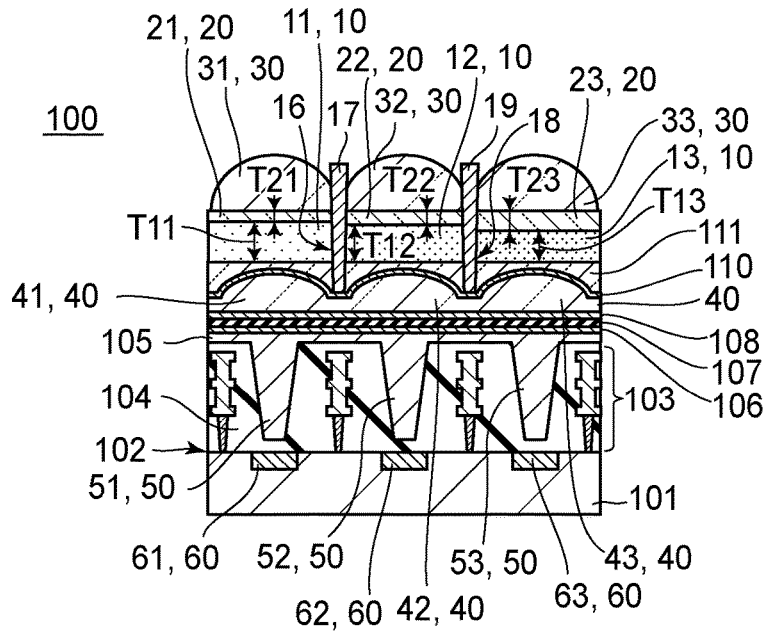
FIG. 7C is a schematic diagram illustrating the next process of the method for manufacturing the device.

In an embodiment illustrated in FIG. 7C, the partitioning member 17 extends between the first microlens 31 and the second microlens 32. The partitioning member 19 extends between the second microlens 32 and the third microlens 33. For that reason, the distance from the main surface 102 of the substrate 101 to the upper ends of the partitioning members 17 and 19 is larger than the distance from the main surface 102 of the substrate 101 to the upper surface of the light transmissive layer 20. A method for manufacturing the device 100 according to the embodiment in FIG. 7C will be described. In the process of FIG. 5B, the partition material 118 is deposited thick.

In the process of FIG. 7A, the partition material 118 is deposited, and a mask 119 is used as a photoresist in pattering by photolithography. The partition material 118 is removed by dry etching using the mask 119. Thus, the partitioning members 17 and 19 in FIG. 7B are formed. Next, as illustrated in FIG. 7C, the microlens 31, 32, 33 are formed between the partitioning members 17 and 19. The reflection at the boundary between the microlens layer 30 and the partitioning members 17 and 19 increases because of the refractive index, so that the sensitivity is improved.

Figure 8A:
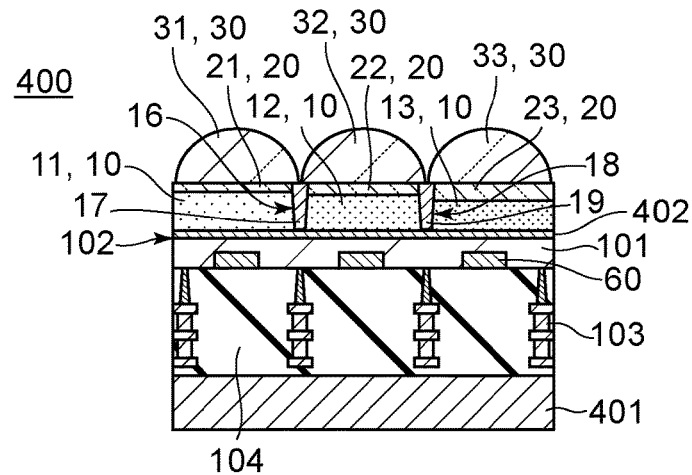
FIG. 8A is a schematic diagram of a device according to another embodiment of the present disclosure.

In the above embodiments, the device 100 is a surface-irradiation-type image capturing device. The present technique is also applicable to a back-irradiation-type image capturing device. In a back-irradiation-type image capturing device 400 illustrated in FIG. 8A, the color filter layer 10, the light transmissive layer 20, the microlens layer 30 are disposed on the substrate 101 including the photoelectric conversion elements 61, 62, and 63, with a light transmissive film 402 therebetween. The multilayer wiring line 103 is disposed opposite to the color filter layer 10 with respect to the substrate 101. The substrate 101 is a semiconductor layer as thin as 1 to 10 µm. The substrate 101 and the color filter layer 10 are supported by a support substrate 401 disposed opposite to the substrate 101 with respect to the multilayer wiring line 103. The color filter layer 10 and the light transmissive layer 20 have the grooves 16 and 18 in which the partitioning members 17 and 19 are respectively disposed.

Figure 8B:
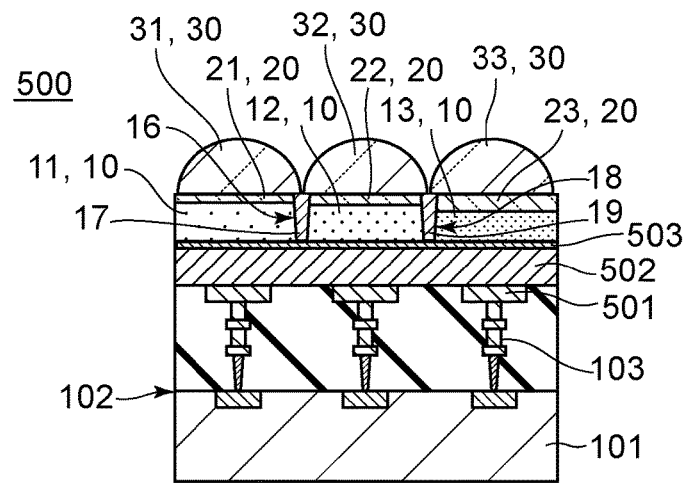
FIG. 8B is a schematic diagram of a device according to another embodiment of the present disclosure.

The present technique is also applicable to a photoelectric-conversion-film-type image capturing device. A photoelectric-conversion-film-type image capturing device 500 illustrated in FIG. 8B includes a photoelectric conversion film 502 above the substrate 101 including a pixel circuit. Electric charges generated from the photoelectric conversion film. 502 are read via the multilayer wiring line 103 by pixel electrodes 501 disposed between the photoelectric conversion film 502 and the substrate 101. The photoelectric-conversion-film-type image capturing device 500 includes a transparent electrode 503 on the opposite side of the pixel electrodes 501 with respect to the photoelectric conversion film 502. The color filter layer 10, the light transmissive layer 20, and the microlens layer 30 are disposed on the transparent electrode 503. The grooves 16 and 18 are disposed in the color filter layer 10 and the light transmissive layer 20, and the partitioning members 17 and 19 are respectively disposed in the grooves 16 and 18.

Figure 8C:
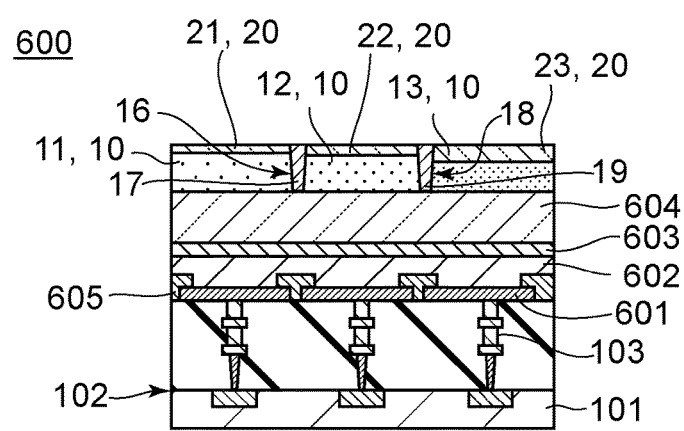
FIG. 8C is a schematic diagram of a device according to another embodiment of the present disclosure.

The present embodiment is applicable not only to the image capturing device but also to a display device 600. An organic electroluminescence (EL)-type display device 600 illustrated in FIG. 8C includes a pixel electrodes 601, a light emitting layer 602, and a transparent electrode 603 layered above the substrate 101. The light emitting layer 602 may be either an organic material layer or an inorganic material layer. A light transmissive film 604 is formed on a light emitting element including a pixel electrodes 601, a light emitting layer 602, and a transparent electrode 603. The color filter layer 10 and the light transmissive layer 20 are disposed on the light transmissive film 604. The grooves 16 and 18 are disposed in the color filter layer 10 and the light transmissive layer 20, and the partitioning members 17 and 19 are respectively disposed in the grooves 16 and 18.

FIG. 1B illustrates an example of equipment EQP including the image capturing apparatus APR. The image capturing device IC including a photoelectric conversion area PX may further include a peripheral circuit area PR in which a peripheral circuit is disposed. The peripheral circuit may also be provided in another semiconductor chip. The semiconductor chip including the peripheral circuit and semiconductor chip including the photoelectric conversion area PX may also be layered.

In addition to the image capturing device IC including the substrate 101, the image capturing apparatus APR can include a package PKG for containing the image capturing device IC. The package PKG may include a base member to which the image capturing device IC is fixed, a cover member, such as glass, facing the image capturing device IC, and connecting members, such as bonding wires and bumps, connecting terminals provided on the base member and terminals provided on the image capturing device IC.

The equipment EQP may further include at least one of an optical system OPT, a control unit CTRL, a processing unit PRCS, a display unit DSPL, and a memory MMRY. The optical system OPT is used to form an image on the image capturing apparatus APR. Examples include a lens, a shutter, and a mirror. The control unit CTRL is used to control the image capturing apparatus APR. An example is a semiconductor device, such as an application specific integrated circuit (ASIC). The processing unit PRCS is used to process a signal output from the image capturing apparatus APR. This is a processing unit, such as a central processing unit (CPU) or an ASIC, for constituting analog front end (AFE) or a digital front end (DFE). The display unit DSPL is an EL display unit or a liquid crystal display unit which displays information (an image) acquired by the image capturing apparatus APR. The memory MMRY is a magnetic device or a semiconductor device that stores information (an image) acquired by the image capturing apparatus APR. Examples of the memory MMRY include volatile memories, such as SRAM and DRAM, and non-volatile memories, such as a flash memory and a hard disk drive. A mechanical unit MCHN includes a moving unit or a driving unit, such as a motor or an engine. In addition, an image capturing device in which the present technique is applied to the display unit DSPL may be used. In that case, signals processed by the processing unit PRCS are input to the display unit DSPL.

The equipment EQP illustrated in FIG. 1B may be electronic equipment, such as an information terminal having a shooting function or a camera. The mechanical unit MCHN in the camera can drive the components of the optical system OPT. The equipment EQP may also be transport equipment, such as a vehicle, a ship, or an aircraft. The mechanical unit MCHN in the transport equipment is used as a moving unit. The equipment EQP serving as transport equipment is suitable for transporting the image capturing apparatus APR, or assisting and/or automating driving (operation) of the transport equipment with the shooting function. The processing unit PRCS for assisting and/or automating driving (operation) can perform processing for operating the mechanical unit MCHN serving as a moving unit on the basis of information acquired by the image capturing apparatus APR.

Using the image capturing apparatus APR according to the present embodiment reduces or eliminates occurrence of color mixing even for strong light such as sunlight and vehicle headlights while improving the light use efficiency. Thus, when the image capturing apparatus APR is mounted to transport equipment to capture an image of the outside of the transport equipment or to measure the external environment, high-quality images and high measurement accuracy can be obtained. Thus, for manufacturing and selling transport equipment, it is advantageous to decide to mount the image capturing apparatus APR of the present embodiment in transport equipment in order to enhance the performance of the transport equipment.

It is to be understood that the above-described embodiments can be modified as appropriate without departing from the spirit of the present disclosure.

The present technique provides a device having improved optical characteristics.

While the present disclosure has been described with reference to example embodiments, it is to be understood that the present disclosure is not limited to the disclosed example embodiments. The scope of the following claims is to be accorded the broadest interpretation so as to encompass all such modifications and equivalent structures and functions.

This application claims the benefit of Japanese Patent Application No. 2017-063072 filed Mar. 28, 2017, which is hereby incorporated by reference herein in its entirety.

What is claimed is:

1. A device comprising:
a substrate;
a color filter layer disposed on the substrate, the color filter layer comprising a first color filter and a second color filter;
a light transmissive layer disposed opposite to the substrate with respect to the color filter layer, the light transmissive layer comprising a first light transmissive portion located on the first color filter and a second light transmissive portion located on the second color filter,
wherein the color filter layer and the light transmissive layer have a groove between the first color filter and the second color filter and between the first light transmissive portion and the second light transmissive portion; and
a member disposed at least in a portion of the groove between the first color filter and the second color filter,
wherein the member has a refractive index ranging from 1.4 to 1.5, and the first color filter and the second color filter have a refractive index ranging from 1.6 to 1.8.

2. A device comprising:
a substrate;
a color filter layer disposed on the substrate, the color filter layer comprising a first color filter and a second color filter;
a light transmissive layer disposed on an opposite side of the substrate with respect to the color filter layer, the light transmissive layer comprising a first light transmissive portion located on the first color filter and a second light transmissive portion located on the second color filter;
a microlens layer comprising a first microlens disposed above the first color filter and a second microlens disposed above the second color filter,
wherein the color filter layer and the light transmissive layer have a groove between the first color filter and the second color filter and between the first light transmissive portion and the second light transmissive portion; and
a member disposed at least in a portion of the groove between the first color filter and the second color filter,
wherein the member extends between the first light transmissive portion and the second light transmissive portion, between the first light transmissive portion and the first microlens, and between the second light transmissive portion and the second microlens.

3. A device comprising:
a substrate;
a color filter layer disposed on the substrate, the color filter layer comprising a first color filter and a second color filter;
a light transmissive layer disposed opposite to the substrate with respect to the color filter layer, the light transmissive layer comprising a first light transmissive portion located on the first color filter and a second light transmissive portion located on the second color filter;
a microlens layer comprising a first microlens disposed above the first color filter and a second microlens disposed above the second color filter,
wherein the color filter layer and the light transmissive layer have a groove between the first color filter and the second color filter and between the first light transmissive portion and the second light transmissive portion; and
a member disposed at least in a portion of the groove between the first color filter and the second color filter,
wherein the microlens layer extends between the first light transmissive portion and the second light transmissive portion.

4. The device according to claim 2,
wherein the first light transmissive portion is located between the first microlens and the first color filter, and
wherein the second light transmissive portion is located between the second microlens and the second color filter.

5. The device according to claim 3, wherein the microlens layer is in contact with the light transmissive layer.

6. The device according to claim 2, wherein a distance between an end of the member opposite to the substrate and the substrate is equal to a distance between a surface of the light transmissive layer opposite to the substrate and the substrate, or smaller than the distance between file surface of the light transmissive layer opposite to the substrate and the substrate.

7. The device according to claim 1, further comprising a microlens layer comprising a first microlens disposed above the first color filter and a second microlens disposed above the second color filter.

8. The device according to claim 3, wherein the member extends between the first microlens and the second microlens.

9. The device according to claim 2,
wherein the first color filter is thicker than the second color filter, and
wherein the first light transmissive portion is thinner than the second light transmissive portion.

10. The device according to claim 2, further comprising a light transmissive film disposed between the color filter layer and the substrate,
wherein the groove is provided also in the light transmissive film.

11. The device according to claim 2, further comprising a light transmissive film disposed between the color filter layer and the substrate, the light transmissive film being in contact with the color filter layer,
wherein the light transmissive film forms a bottom of the groove.

12. The device according to claim 2, further comprising an interlayer lens layer comprising a first interlayer lens disposed between the first color filter and the substrate and a second interlayer lens disposed between the second color filter and the substrate.

13. The device according to claim 12, wherein the groove extends between the first interlayer lens and the second interlayer lens.

14. The device according to claim 2, wherein the member has a refractive index lower than a refractive index of the first color filter and a refractive index of the second color filter.

15. The device according to claim 2, wherein the member has a refractive index lower than a refractive index of the first light transmissive portion and a refractive index of the second light transmissive portion.

16. The device according to claim 2, further comprising a plurality of light guides between the color filter layer and the substrate, each light guide being surrounded by an interlayer insulating film,
wherein a difference in refractive index between the first color filter and the member is smaller than a difference in refractive index between the interlayer insulating film and the plurality of light guides.

17. The device according to claim 2, wherein the member is a material containing silicon oxide, a material containing silicon oxynitride, or a material containing plurality of voids.

18. The device according to claim 2, further comprising a photoelectric conversion element in the substrate.

19. An electronic apparatus comprising:
   the device according to claim 12; and
   a processing unit configured to process a signal to be input to the device or a signal output from the device.

20. A transport apparatus comprising:
   a moving unit;
   the device according to claim 2; and
   a processing unit configured to process a signal output from the device to control the moving unit.

* * * * *